US009666530B1

(12) United States Patent
Chen et al.

(10) Patent No.: US 9,666,530 B1
(45) Date of Patent: May 30, 2017

(54) SEMICONDUCTOR DEVICE

(71) Applicant: TAIWAN SEMICONDUCTOR MANUFACTURING COMPANY LTD., Hsinchu (TW)

(72) Inventors: Chen-Shien Chen, Hsinchu County (TW); Yu-Chih Huang, Hsinchu (TW); Yu-Feng Chen, Hsinchu (TW); Kuo-Lung Pan, Hsinchu (TW); Yu-Jen Cheng, New Taipei (TW); Mirng-Ji Lii, Hsinchu County (TW); Han-Ping Pu, Taichung (TW); Wei-Sen Chang, Kinmen County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/981,600

(22) Filed: Dec. 28, 2015

(51) Int. Cl.
*H01L 23/528* (2006.01)
*H01L 23/00* (2006.01)
*H01L 23/31* (2006.01)
*H01L 21/683* (2006.01)
*H01L 21/768* (2006.01)

(52) U.S. Cl.
CPC ........ *H01L 23/528* (2013.01); *H01L 21/6835* (2013.01); *H01L 21/76895* (2013.01); *H01L 23/3107* (2013.01); *H01L 24/05* (2013.01); *H01L 2221/68359* (2013.01); *H01L 2221/68363* (2013.01); *H01L 2224/02371* (2013.01); *H01L 2224/0401* (2013.01)

(58) Field of Classification Search
CPC ..... H01L 23/48; H01L 21/56; H01L 23/3192; H01L 23/49816; H01L 23/49822; H01L 23/39894; H01L 23/53898; H01L 23/5389; H01L 23/64; H01L 24/19; H01L 2224/0401; H01L 2224/12105
USPC ........ 257/774, 773, 737, 738, 528; 438/124, 438/381, 613
See application file for complete search history.

(56) References Cited

U.S. PATENT DOCUMENTS

| | | | | |
|---|---|---|---|---|
| 6,306,680 B1 * | 10/2001 | Fillion | ................ | H01L 23/3121 257/E21.508 |
| 9,040,381 B2 * | 5/2015 | Yu | ........................ | H01L 23/3192 257/528 |
| 2015/0162288 A1 * | 6/2015 | Miao | ........................ | H01L 24/05 257/773 |
| 2015/0162291 A1 * | 6/2015 | Miao | ........................ | H01L 24/11 257/737 |

* cited by examiner

*Primary Examiner* — Alexander Oscar Williams
(74) *Attorney, Agent, or Firm* — WPAT, P.C., Intellectual Property Attorneys; Anthony King

(57) ABSTRACT

A semiconductor device includes a semiconductor substrate, a conductive pad on the semiconductor substrate, and a first dielectric over the semiconductor substrate. The semiconductor device also includes a conductive layer disposed in the first dielectric and a second dielectric disposed on the conductive layer. In the semiconductor device, at least a portion of the conductive layer is exposed from the first dielectric and second dielectric. The semiconductor device further includes a conductive trace partially over the second dielectric and in contact with the exposed portion of the conductive layer. In the semiconductor device, the conductive trace is connected to the conductive pad at one end.

20 Claims, 16 Drawing Sheets

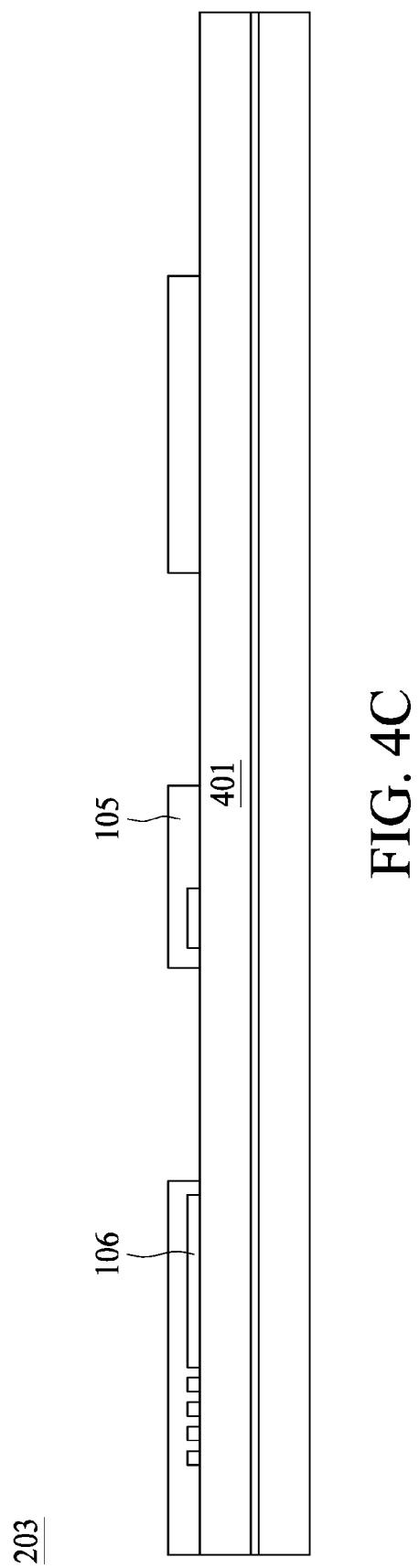

SEMICONDUCTOR DEVICE

FIELD

The disclosure relates to a semiconductor device and a method of manufacturing a semiconductor device.

BACKGROUND

Electronic equipments involving semiconductor devices are indispensable from our daily life. With the advancement of electronic technology, electronic equipments become more complicated and involve greater amount of integrated circuitry for executing the desired multi-functionality. Thus, manufacturing of the electronic equipments includes more and more steps of assembly and processing as well as materials for producing the semiconductor devices in the electronic equipments. Therefore, there is a continuous demand on simplifying the steps of production, increasing production efficiency and lowering associated manufacturing cost on each electronic equipment.

During the operations of manufacturing the semiconductor devices, the semiconductor devices are assembled with numbers of integrated components including various materials with difference in thermal properties. As such, the integrated components are in undesired configurations after curing of the semiconductor device. The undesired configurations would lead to yield loss of the semiconductor devices, poor bondability between the components, development of cracks, delamination of the components or etc. Furthermore, the components of the semiconductor devices include various metallic materials which are in limited quantity and thus in a high cost. The undesired configurations of the components and the yield loss of the semiconductor devices would further exacerbate materials wastage and thus the manufacturing cost would increase.

As more different components with different materials are involved and a complexity of the manufacturing operations of the semiconductor device is increased, there are more challenges to modify a structure of the semiconductor device and improve the manufacturing operations. As such, there is a continuous need to improve the method for manufacturing the semiconductor and solve the above deficiencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A-FIG. 4K represent a flow diagram of a method of manufacturing a semiconductor device in accordance with some embodiments.

DETAILED DESCRIPTION

Figure 1:
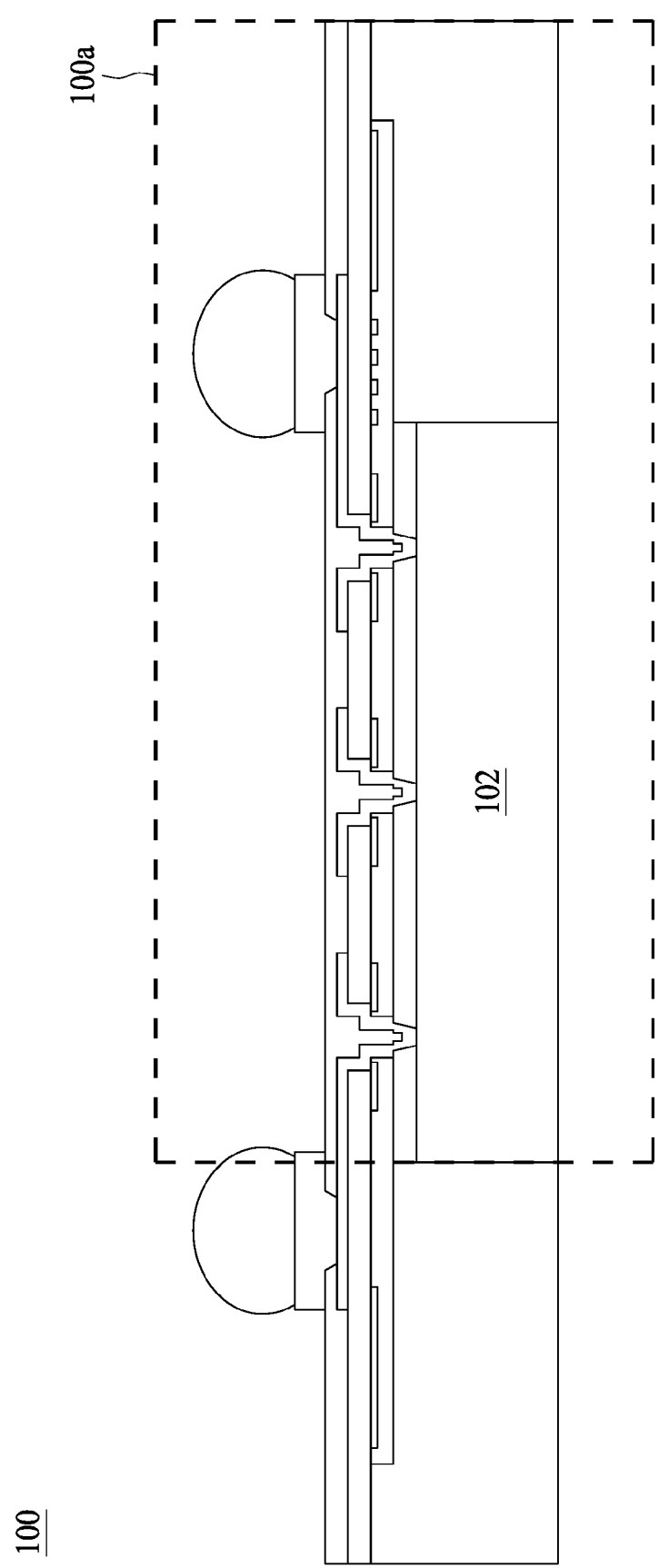
FIG. 1 is a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, a semiconductor device is provided to have an innovative stacking interconnects for routing area reduction and better routing capability. In the present disclosure, the semiconductor component includes stacking interconnects designed in donut shape or C shape. The donut shape or C shape interconnects are proposed to increase feasibility of conductive trace routing in fine pitch fan-out package. By the present disclosure, the routing area reduction and better routing capability may be achieved.

In the present disclosure, a conductive trace is configured to line along a recess of a film stack. The film stack may be a composite dielectric structure and including some interconnect conductive trace inside. The conductive trace is connected to a conductive pad at one end and extended to be over the composite dielectric structure. On the other end of the conductive trace, a conductive bump or UBM is connected therein. The conductive trace is in contact with a portion of the interconnect conductive trace inside the composite dielectric such that an electrical connection is formed between the interconnect conductive trace and conductive pad.

FIG. 1 is an embodiment of a semiconductor device 100. Semiconductor device 100 includes a semiconductor substrate 102. In some embodiments, the semiconductor substrate 102 includes semiconductor materials such as silicon, and is fabricated with a predetermined functional circuit within the semiconductor substrate 102 produced by various operations such as photolithography, etch, deposition, plating, etc. In some embodiments, the semiconductor substrate 102 is singulated from a silicon wafer by a mechanical or laser blade. In some embodiments, the semiconductor substrate 102 is in a quadrilateral, a rectangular or a square shape.

Figure 1A:
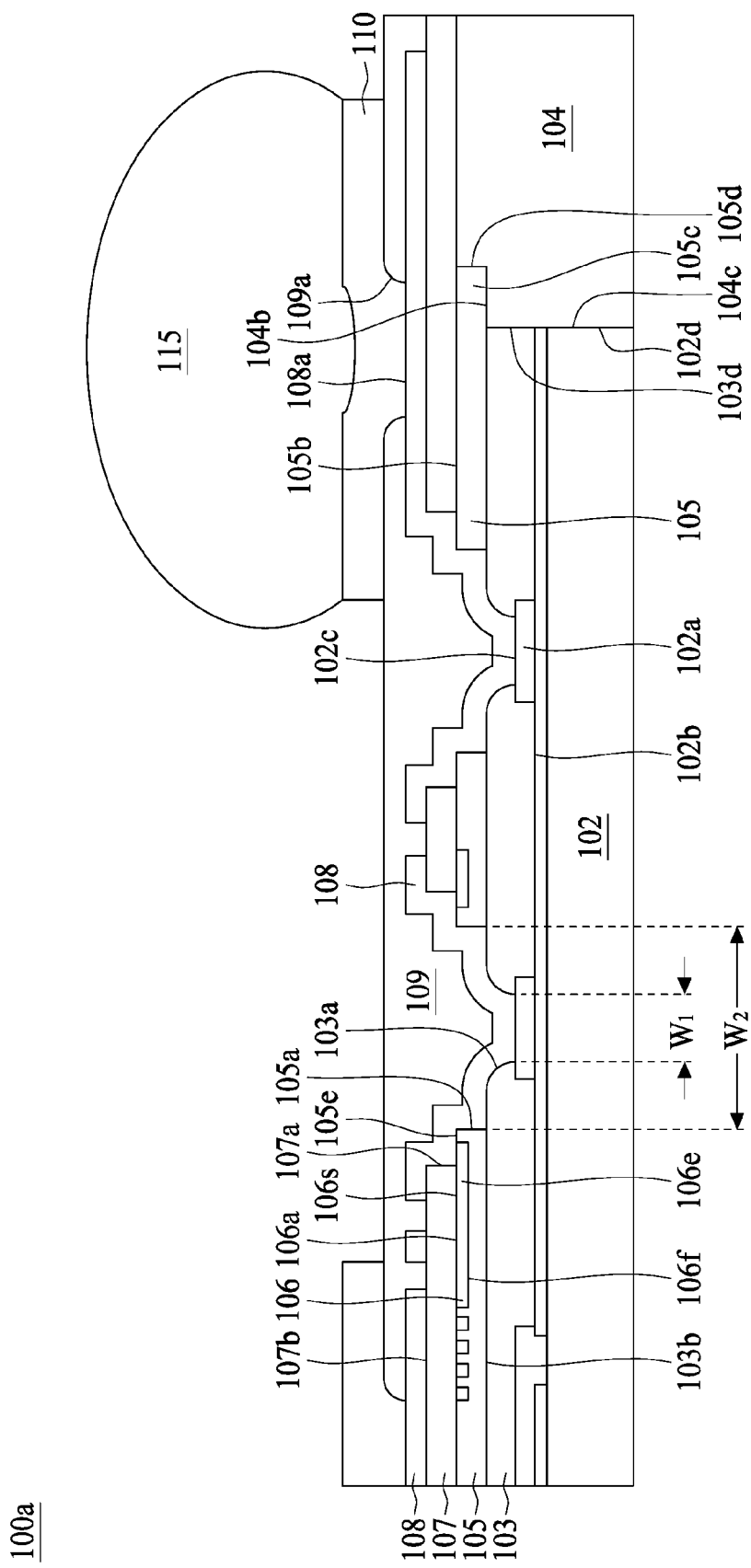
FIG. 1A is an enlarged view of a portion of a semiconductor device in FIG. 1 in accordance with some embodiments.

FIG. 1A is an enlarged view of a portion 100a of the semiconductor device 100 in FIG. 1. The semiconductor substrate 102 includes a surface 102b and a conductive pad 102a is disposed on the surface 102b. In some embodiments, the conductive pad 102a is electrically connected with a circuitry external to the semiconductor substrate 102, so that a circuitry inside the semiconductor substrate 102 is electrically connected with the circuitry external to the semiconductor substrate 102 through the conductive pad 102a. In some embodiments, the conductive pad 102a is configured for electrically coupling with a conductive bump through a conductive trace attached on the conductive pad 102a, so that the circuitry inside the semiconductor substrate 102 is connected with the circuitry external to the semiconductor substrate 102 from the conductive pad 102a to the conductive bump through the conductive trace. In some embodiments, the conductive pad 102a includes gold, silver, copper, nickel, tungsten, aluminum, palladium and/or alloys thereof.

In some embodiments, a passivation 103 is disposed over the surface 102b of the semiconductor substrate 102 and partially covering the conductive pad 102a. In some embodiments, the passivation 103 surrounds the conductive pad 102a. A portion of conductive pad 102a is exposed from a recess 103a in the passivation 103. In some embodiments, the passivation 103 partially covers a top surface 102c of the conductive pad 102a. The passivation 103 is configured for providing an electrical insulation and a moisture protection for the semiconductor substrate 102, so that the semiconductor substrate 102 is isolated from ambient environment. In some embodiments, the passivation 103 is formed with dielectric materials such as spin-on glass (SOG), silicon oxide, silicon oxynitride, silicon nitride or the like. In some embodiments, the passivation 103 is formed with a vapor deposition or a spin coating process.

In some embodiments, a dielectric 105 is disposed over the passivation 103. The dielectric 105 is disposed on top surface 103b of the passivation 103. In some embodiments, the dielectric 105 includes a polymeric material such as epoxy, polyimide, polybenzoxazole (PBO), solder resist (SR), ABF film, and the like. Passivation 103 is partially covered by dielectric 105. However, a portion of passivation 103 is exposed from dielectric 105 through a recess 105a in dielectric 105. The recess 105a in dielectric 105 is substantially aligned with the recess 103a in passivation 103 such that conductive trace 108 is able to travel along the recess 105a in dielectric 105 and further down to the recess 103a in passivation 103. Conductive trace 108 is landed on a portion of conductive pad 102a, wherein the portion is exposed from passivation 103 through recess 103a. In some embodiments, conductive trace 108 is conformally lining along recess 103a and recess 105a. In some embodiments, the recess 105a has a width $W_2$ and the width $W_2$ is equal or larger than a width $W_1$ of the recess 103a.

In addition to the recess 105a, conductive trace 108 also travels along another portion of dielectric 105. As shown in FIG. 1A, conductive trace 108 is also lined along a surface 105e, which is substantially arranged orthogonal to sidewall of recess 105a. Surface 105e is a plane opposite to the interface between passivation 103 and dielectric 105.

A conductive layer 106 is substantially disposed proximal to surface 105e, which is an interface between dielectric 105 and dielectric 107. In some embodiments, conductive layer 106 is spaced from the interface between dielectric 105 and passivation 103 with a predetermined distance. In some embodiments, the predetermined distance is greater than 0. Conductive layer 106 is partially surrounded by dielectric 105 but has at least one side exposed from dielectric 105. Conductive layer 106 is disposed at a different level and parallel to the conductive pad 102a. The isolation between conductive layer 106 and conductive pad 102a is composed by at least passivation 103 and dielectric 105. The interface between passivation 103 and dielectric 105 is between conductive layer 106 and conductive pad 102a.

One side of the conductive layer 106 is uncovered or not surrounded by dielectric 105 but is partially covered by a dielectric 107, which is disposed over dielectric 105 and passivation 103. In some embodiments, the dielectric 107 includes a polymeric material such as epoxy, polyimide, polybenzoxazole (PBO), solder resist (SR), ABF film, and the like. A portion 106e of the conductive layer 106 is exposed from dielectric 107 through a recess 107a in dielectric 107. The exposed portion 106e of conductive layer 106 is located at the travel path of conductive trace 108. Exposed portion 106e of conductive layer 106 is also proximal to a corner of the dielectric 105, wherein the corner is for conductive trace 108 travelling by. Conductive trace 108 is electrically connected to the exposed portion of conductive layer 106. In some embodiments, exposed portion connected with conductive trace 108 is substantially coplanar with surface 105e. Through conductive trace 108, conductive layer 106 is electrically connected to conductive pad 102a.

Conductive layer 106 has two sides parallel to conductive pad 102a. One (106f) of the parallel sides is facing the interface between passivation 103 and dielectric 105 and interfacing with dielectric 105. The other parallel side 106s is facing away from the interface between passivation 103 and dielectric 105 but interfacing with dielectric 107. In some embodiments, the other parallel side 106s is in contact with dielectric 107. The exposed portion 106e, which is in connection with conductive trace 108 is located at the parallel side facing away from the interface between passivation 103 and dielectric 105.

Conductive trace 108 travels through exposed portion 106e and further lines along a sidewall of recess 107a. In some embodiments, conductive trace 108 lines along the sidewall of recess 107a and is further bent to a different direction. A portion of conductive trace 108 travels along a surface of dielectric 107, wherein the surface is substantially parallel to conductive layer 106.

Both conductive layer 106 and conductive trace 108 can be configured as a redistribution layer (RDL) or a post passivation interconnect (PPI). Since a portion of conductive trace 108 is stretched to be above conductive 106, the conductive trace 108 is also configured to be connected to a under metal bump (UBM) or a conductive bump. A portion of conductive trace 108 is also configured as an interconnection between conductive layer 106 and conductive pad 102a. One end of conductive trace 108 is connected to conductive pad 102a then extended upwardly and line along the profile of recess 103a, recess 105a, and recess 107a. In the span of extension, conductive trace 108 electrically couples other inter layer RDL, such as conductive layer 106 with conductive pad 102a.

Through conductive trace 108, layout area for disposing an inter via between conductive layer 106 and conductive pad 102a can be saved. Conductive trace 108 can be concurrently configured as a top-level RDL and an interconnect to couple conductive layer between top-level RDL and conductive pad 102a.

Molding compound 104 is surrounding the semiconductor substrate 102, the passivation 103, and the dielectric 105. In some embodiments, the molding 104 is disposed adjacent to a sidewall 102d of the semiconductor substrate 102. In some embodiments, molding 104 is disposed adjacent to a sidewall 103d of the passivation 103, and a sidewall 105d of the dielectric 105. In some embodiments, a top surface 105b of dielectric 105 and a top surface 104a of the molding 104 are substantially coplanar. In some embodiments, a corner 104b of molding 104 is in a stepped configuration. Corner 104b is recessed away the interface 104c between molding 104 and semiconductor substrate 102.

In some embodiments, dielectric 105 is further extended laterally and across interface 104c. A portion 105c of dielectric 105 is laid over molding 104. Molding 104 includes various materials, for example, one or more of epoxy resins, phenolic hardeners, silicas, catalysts, pigments, mold release agents, and the like. Material for forming a molding compound has a high thermal conductivity, a low moisture absorption rate, a high flexural strength at board-mounting temperatures, or a combination of these.

In some embodiments, a dielectric 109 is disposed over the conductive trace 108. In some embodiments, the dielectric 109 includes a recess 109a for receiving a conductive material such as copper or etc. In some embodiments, the dielectric 109 includes a polymeric material such as epoxy, polyimide, polybenzoxazole (PBO), solder resist (SR), ABF film, and the like. Dielectric 107 may be partially exposed through the conductive trace 108 and in contact with the dielectric 109.

The conductive trace 108 is partially covered by the dielectric 109, which is designed to isolate the conductive trace 108 from moisture or reaction. However, at least a portion of conductive trace 108 on the dielectric 107 is exposed from the dielectric 109 through the recess 109a in dielectric 109. The dielectric 109 has the recess 109a to expose a portion of the conductive trace 108 so as to provide a top surface 108a for receiving an under bump metallurgy (UBM) 110. A conductive bump 115 is disposed on UBM 110. In some embodiments, the UBM 110 is formed with gold, silver, copper, nickel, tungsten, aluminum, palladium and/or alloys thereof. In some embodiments, under bump metallurgy (UBM) is an optional feature such that conductive bump 115 is directly disposed on conductive trace 108.

Still referring to FIG. 1A, conductive features in semiconductor device 100 can be classified into three different levels. Taking semiconductor substrate 102 as a reference of a bottommost level in order to better understand the following description. Conductive pad 102a is over the semiconductor substrate 102 and called first level conductor. Conductive layer 106 is called second level conductor. In some embodiments, there is no via or interconnect within dielectric 105 or passivation 103. In other words, the dielectric composite between first level and second level conductors is free of conductive feature. Conductive trace 108 is configured as a partial third level conductor and also extended to be in contact with the first level and second level conductors. The first level conductor (conductive pad 102b) and the second level conductor (conductive layer 106) are electrically connected through a conductor external to a dielectric between the first and second level conductor.

A portion of the third level conductor is lining along the morphology of the recess 103a in passivation 103. In some embodiments, the third level conductor is as a wing and spanning symmetrically from the conductive pad 102a. The dielectric composite (dielectric 105 and dielectric 107) together has a recess with a corner in a stepped configuration and a portion of the third level conductor is lining along the stepped corner.

Figure 1B:
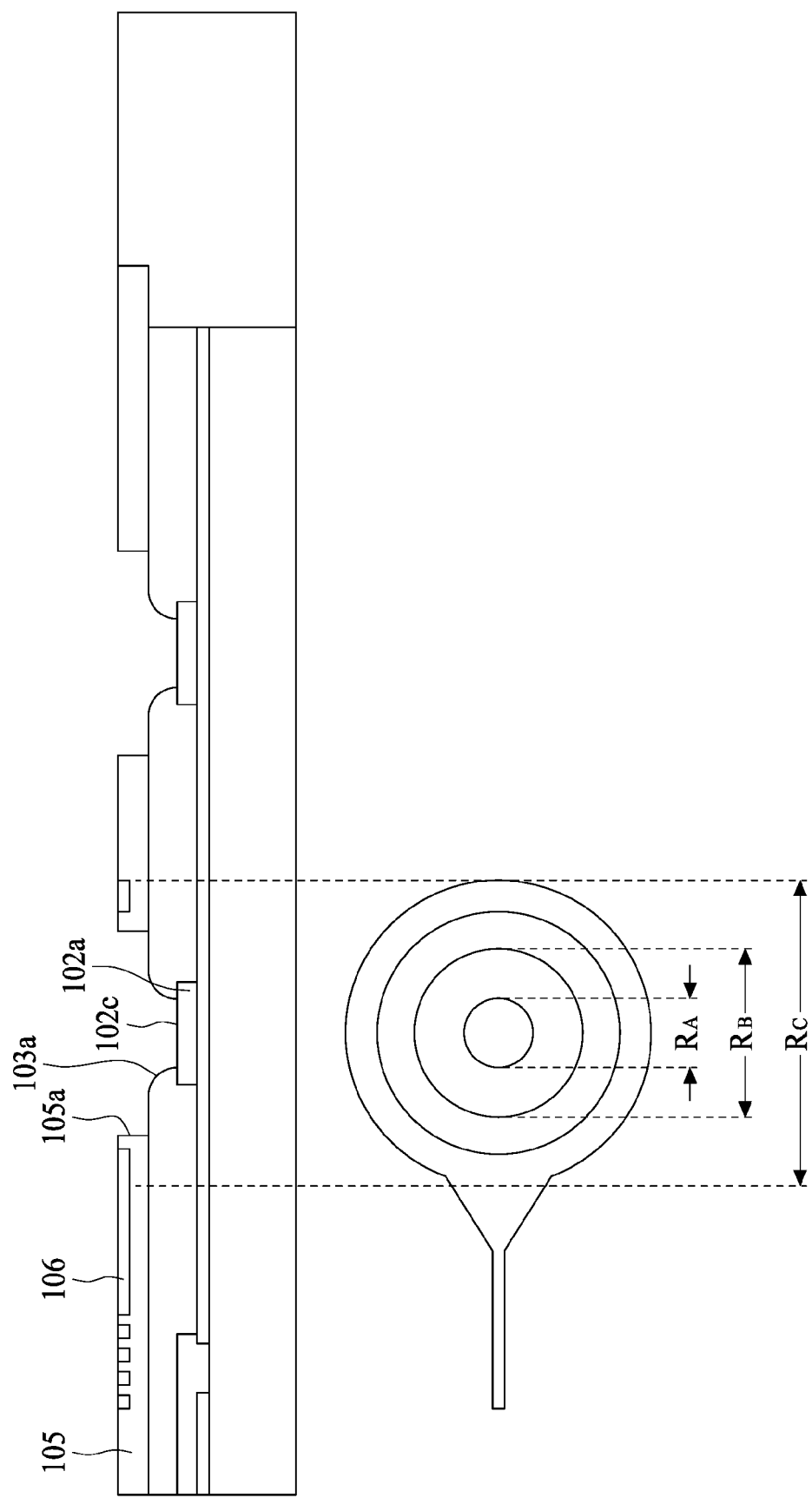
FIG. 1B is a fragmentary view of a portion of a semiconductor device in FIG. 1A in accordance with some embodiments.

FIG. 1B shows a portion of the semiconductor device 100. The upper cross section view is includes conductive pad 102a and conductive layer 106. Conductive trace 108 is omitted in order to simply the illustration. A top view of the conductive pad 102a and conductive layer 106 is illustrated under the cross sectional view. In FIG. 1B, $R_A$ is defined as a diameter of the recess 103a, $R_B$ is defined as a diameter of the recess 105a, and $R_C$ is defined as a diameter of the conductive layer 106. In some embodiments, diameter $R_A$ is smaller than diameter $R_B$, and diameter $R_B$ is smaller than diameter $R_C$. In some embodiments, a portion of the top surface 102c of the conductive pad 102a is exposed through the recess 103a and the recess 105a. From the top view perspective, conductive layer 106 is configured as a loop and conductive pad 102a is located inside the loop. In some embodiments, layout of conductive layer 106 is not overlapped with conductive pad 102a from top view perspective.

Figure 2:
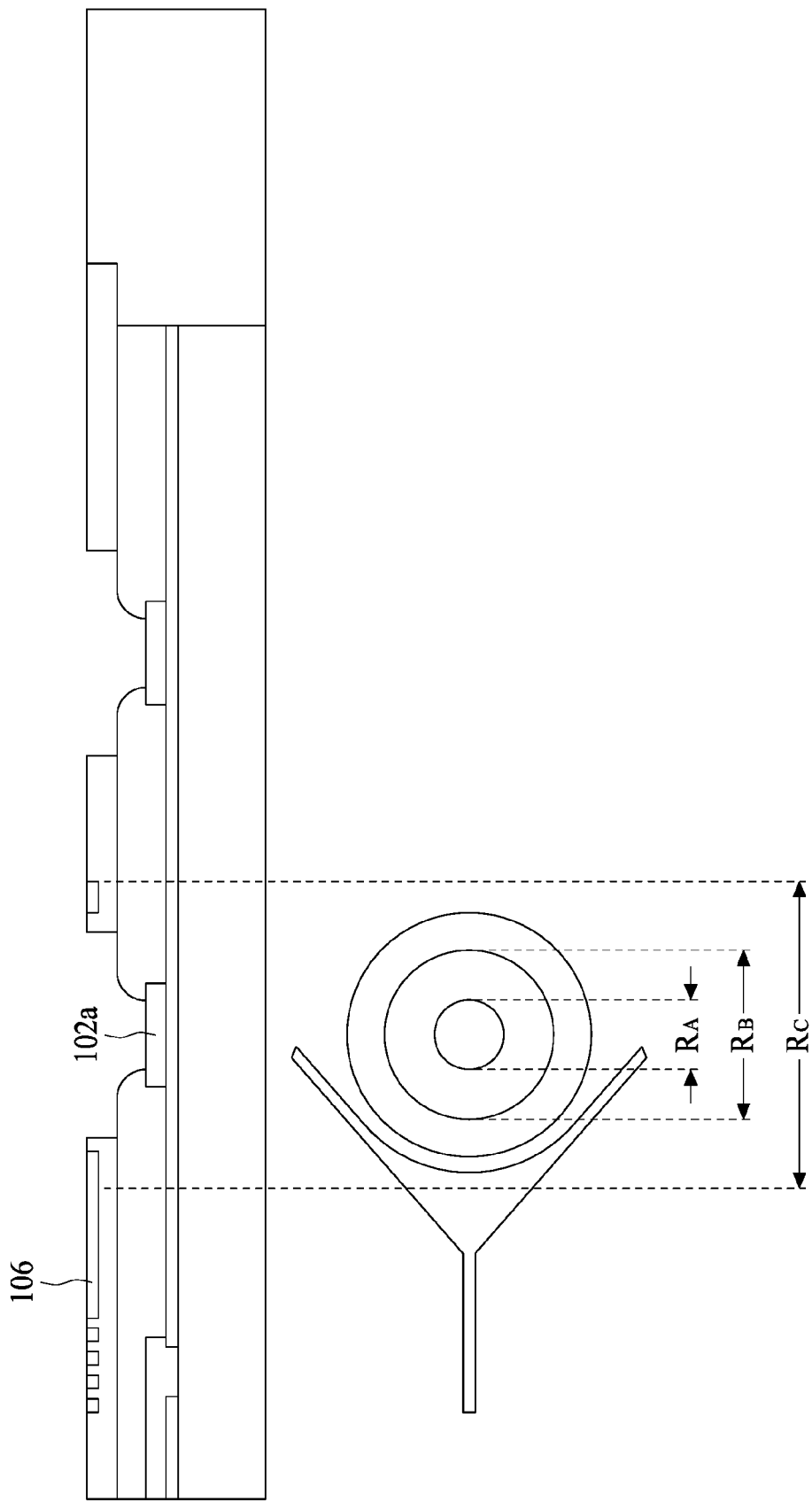
FIG. 2 is a fragmentary view of a portion of a semiconductor device in accordance with some embodiments.

FIG. 2 shows another embodiment of a semiconductor device 300. The semiconductor device 300 includes a structure similar to the semiconductor 100 in FIG. 1B such that details of the elements indicated with the same numerical labels are not repeated herein. The conductive layer 106 around conductive pad 102a is not in a closed loop configuration. From the top view perspective (lower part in the figure), conductive layer 106 is in a C-shape with one end opening. In the cross sectional view, conductive layer 106 only shows in one side of the corresponding conductive pad 102a.

Figure 3:
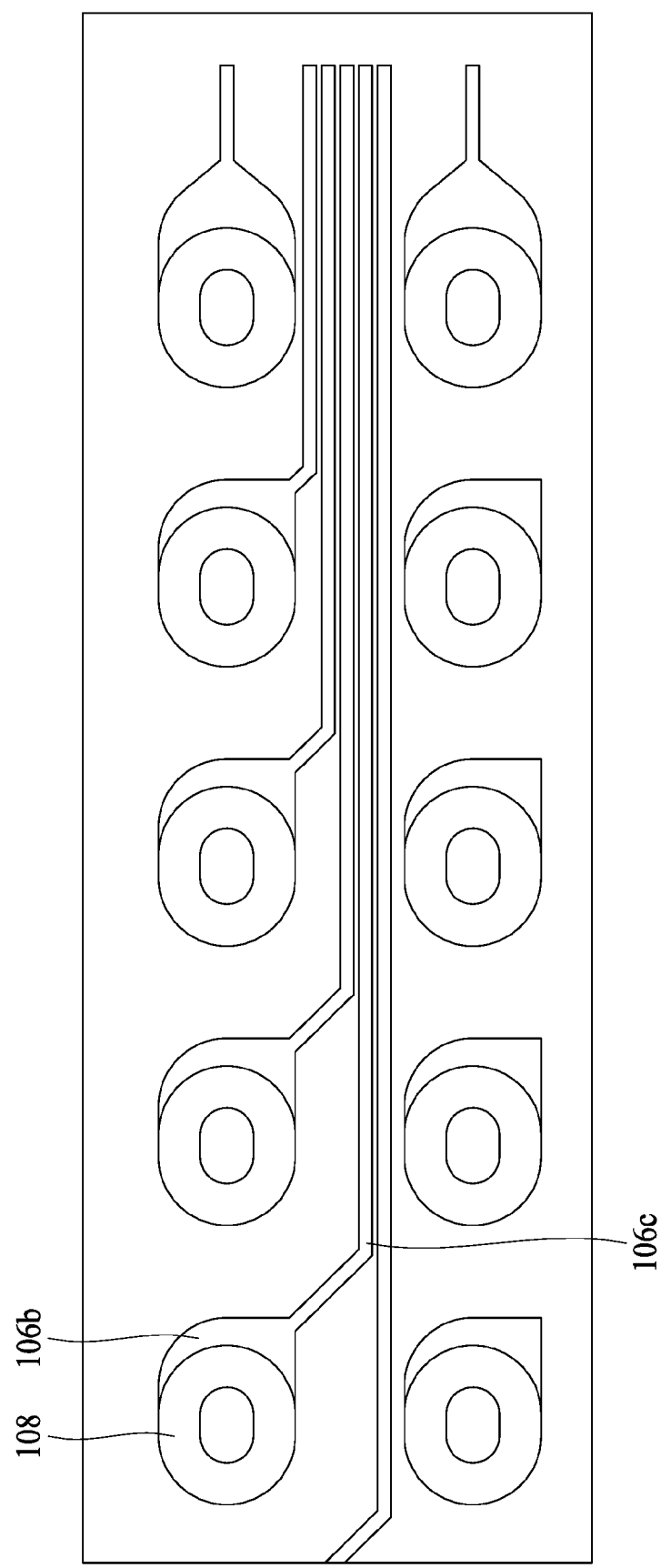
FIG. 3 is a partial top view of the semiconductor device in FIG. 2 in accordance with some embodiments.

FIG. 3 is a top view of a conductive layer disposed under conductive trace 108. Conductive layer includes several C-shaped rings 106b. Each C-shaped ring 106b is partially covered by a corresponding conductive trace 108. Each C-shaped ring 106b also connected to an extension portion 106c. In some embodiments, the extension portion 106c is a running RDL.

FIG. 4A-FIG. 4K include operations of a method of manufacturing a semiconductor device 100 in FIG. 1. The method includes operations, 201, 202, 203, 204, 205, 206, 207, 208, 209 and 210 as shown in the corresponding drawing.

In operation 201, a substrate 400 is provided as a carrier or support. A sacrificial film 401 is disposed on the substrate 400 as in FIG. 4A. In operation 202, a conductive layer 106 is disposed on the sacrificial film 401 as in FIG. 4B. Formation of conductive layer 106 may include patterning a photoresist and then electroplating conductive material into patterned holes or trenches in the photoresist. The photoresist is stripped after the formation of patterned conductive layer 106.

In operation 203, a dielectric 105 is disposed on the sacrificial film 401 and the conductive layer 106 as in FIG. 4C. Formation of dielectric may include some deposition processes to grown a blanket film over the conductive layer 106 and sacrificial film 401. A patterning process is introduced to remove excessive dielectric material to form a patterned dielectric 105.

Figure 4A:
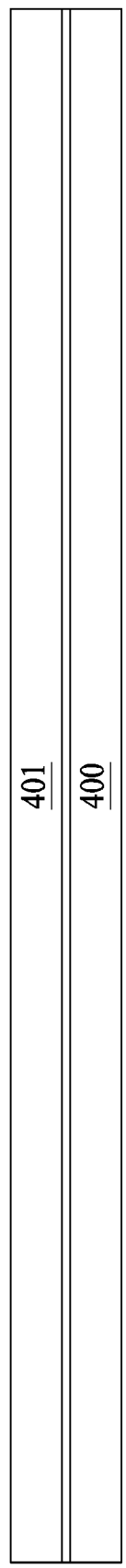
Figure 4B:
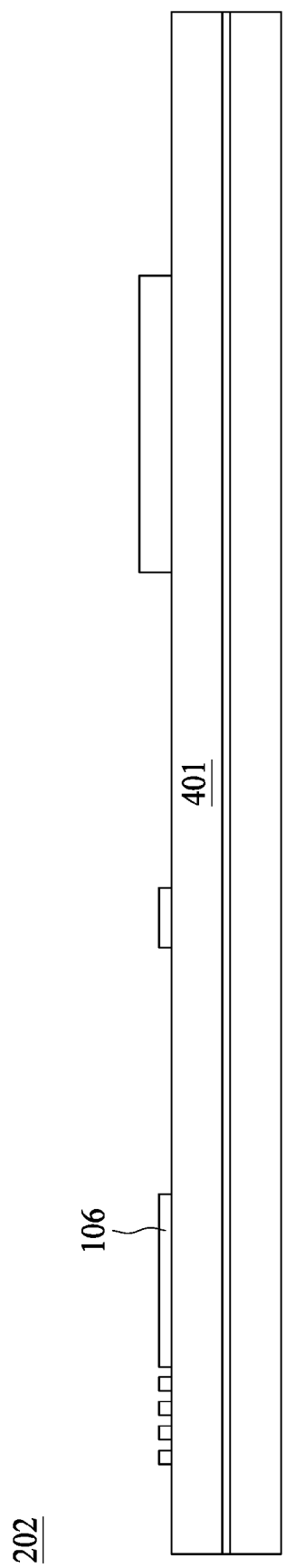
Figure 4D:
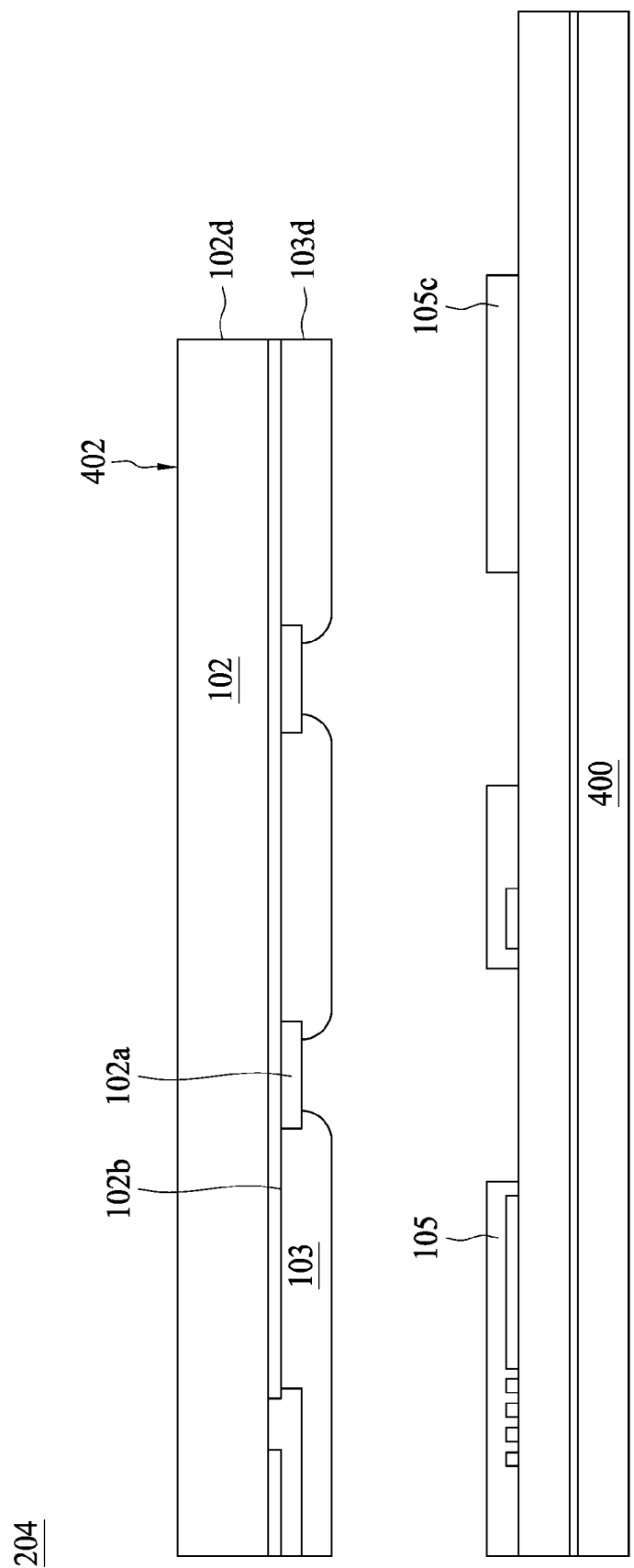
Figure 4E:
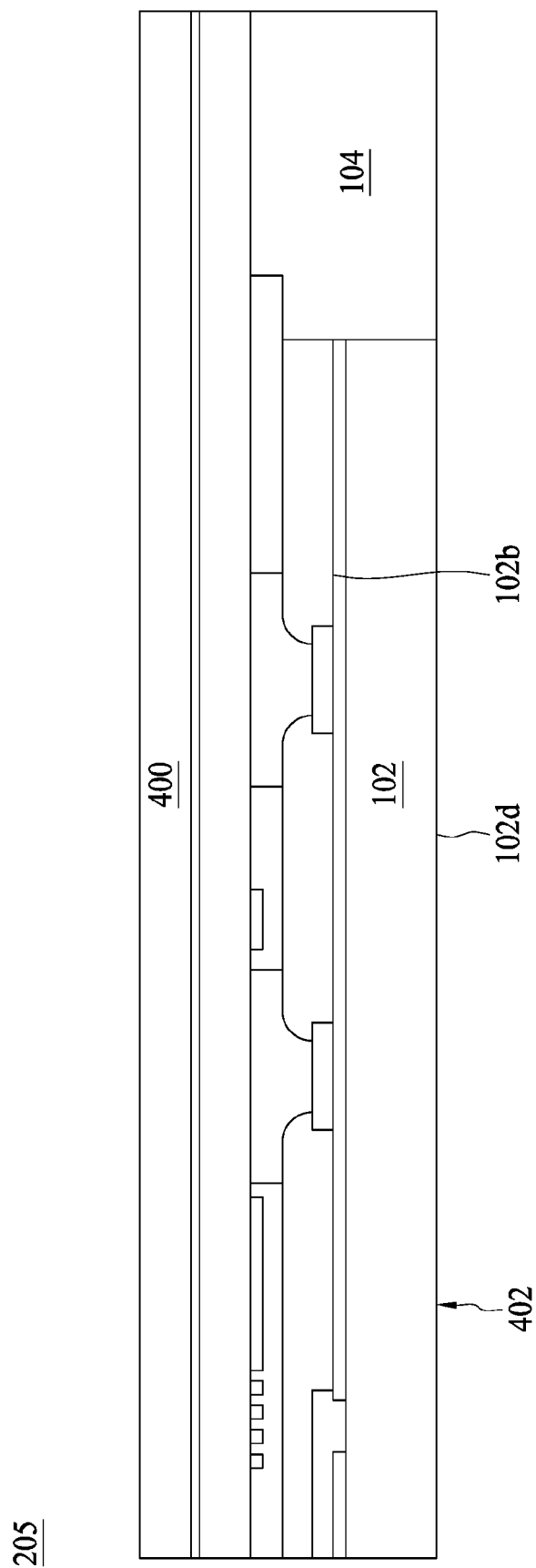
Figure 4F:
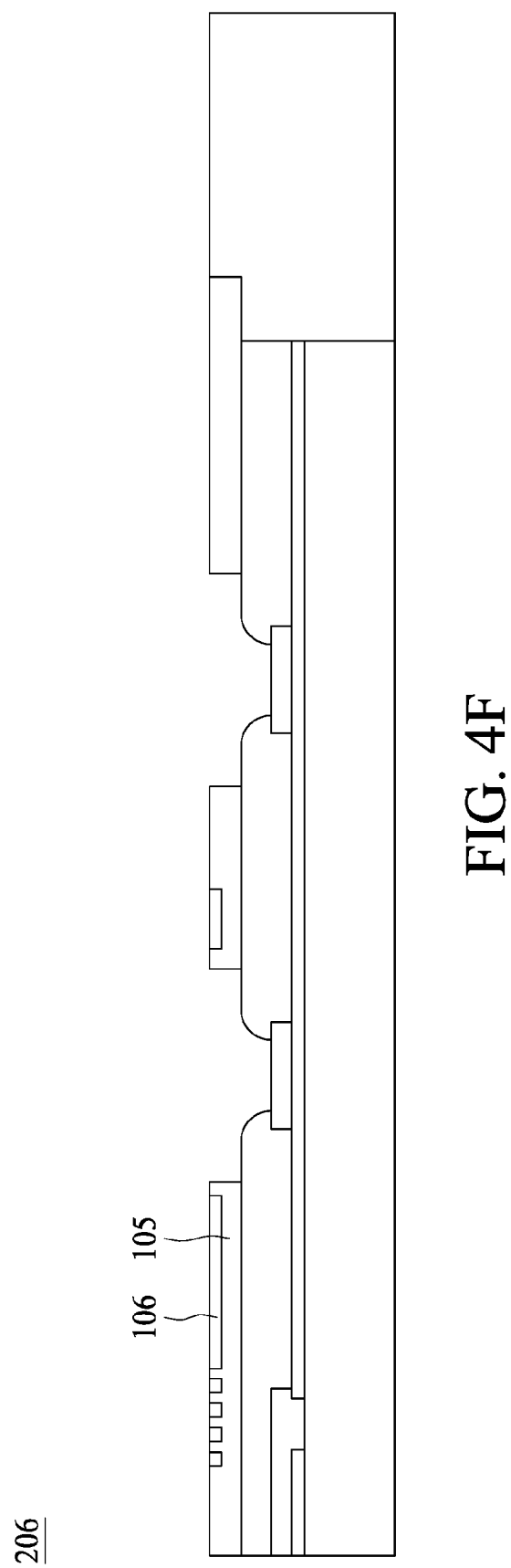
Figure 4G:
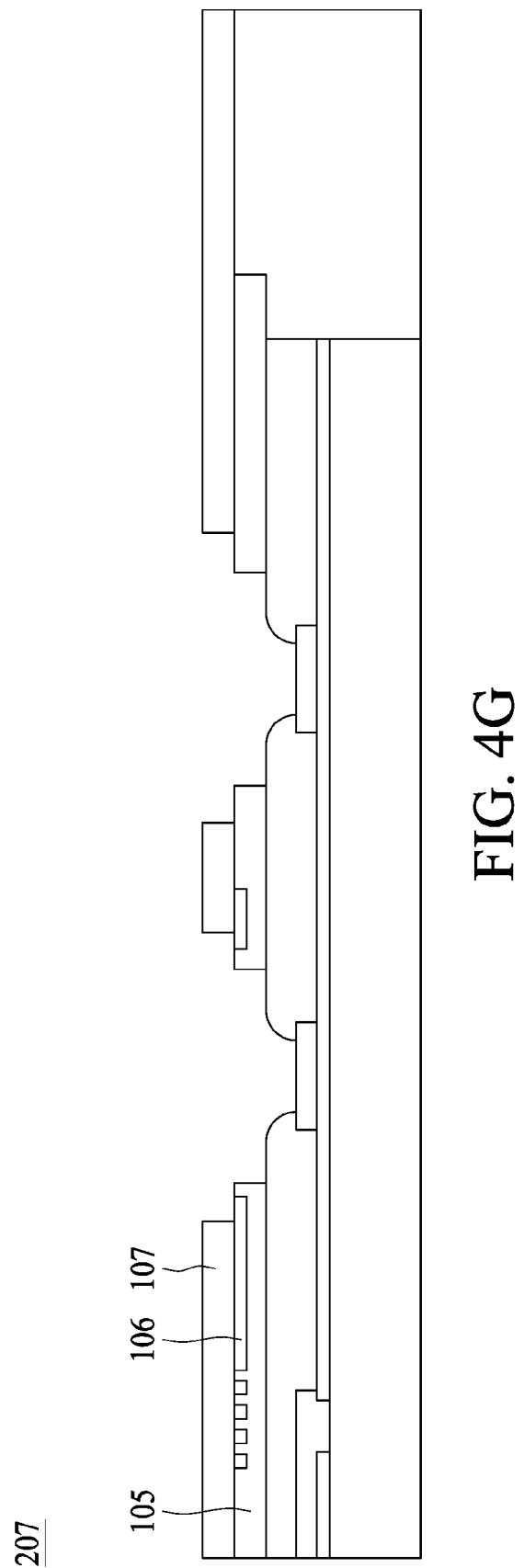

In operation 204, a semiconductor die 402 is provided, and the semiconductor die 402 is flipped upside down and attached to the substrate 400 as in FIG. 4D. The active surface (opposite to the backside of semiconductor substrate 102) is facing toward the conductive layer 106. In some embodiments, the semiconductor die 402 includes a semiconductor substrate 102, conductive pad 102a on a surface 102b of the semiconductor substrate 102, and passivation 103 on the surface 102b. In some embodiments, the substrate 400 is flipped upside down and attached to the semiconductor die 402. In some embodiments, semiconductor die 402 is a semiconductor chip singulated from a wafer. Before disposing over the substrate 400, semiconductor die 402 may be experienced a series of wafer level semiconductor operations. For example, a semiconductor wafer is provided and devices such as CMOS, diode, etc. are formed in the semiconductor substrate.

In some embodiments, the passivation 103 is bonded to the dielectric 105 through a dielectric-to-dielectric bonding. In some embodiments, edge of dielectric 105 is misaligned with the edge of semiconductor substrate 102. As in FIG. 4D, a sidewall edge 102d of semiconductor die 402 is not aligned with an external edge of dielectric 105. In some embodiments, the semiconductor die 402 is attached in a position that a portion 105c of the dielectric 105 is further protruded away from sidewall 102d.

In operation 205, a molding 104 is disposed over the substrate 400 to surround the semiconductor die 402. The substrate 400 is flipped upside down as in FIG. 4E. The molding 104 is disposed on the sacrificial film 401 to surround the semiconductor die 402. A removal or planarization operation is introduced to remove a portion of the molding 104 in order to expose backside 102d of the semiconductor substrate 102. In some embodiments, there is no molding 104 remained on the backside 102d. In some embodiments, the molding 104 is removed by an operation such as etching or grinding in order to be coplanar In operation 206, the substrate 400 and the sacrificial film 401 are removed as in FIG. 4F. One side of conductive layer 106 is exposed from dielectric 105. In operation 207, a dielectric 107 is disposed over the dielectric 105 and the conductive layer 106 as in FIG. 4G. In some embodiments, the dielectric 107 is disposed on the dielectric 105 and a portion of the conductive layer 106. In some embodiments, a portion 106e of the conductive layer 106 is exposed from dielectric 107 through a recess 107a of the dielectric 107.

Figure 4H:
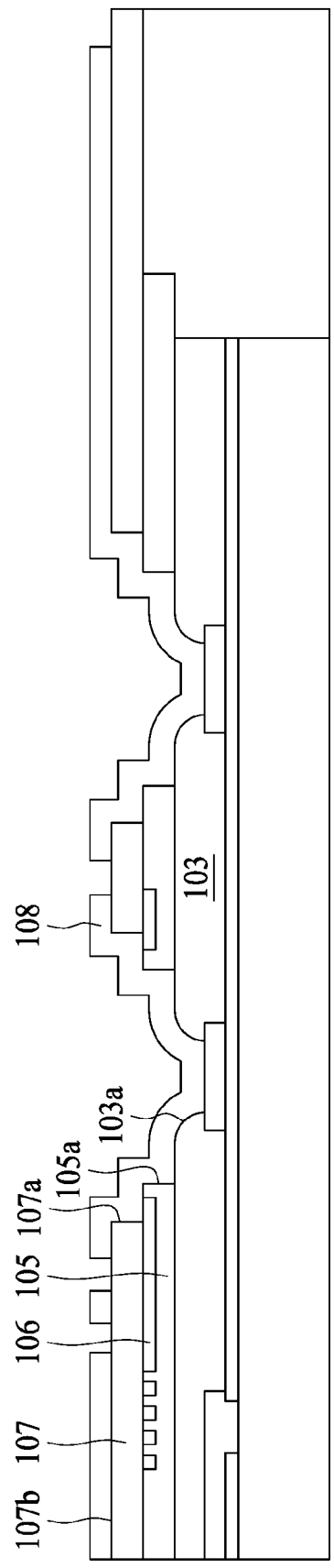

In operation 208, and a conductive trace 108 is disposed over the semiconductor die 402 as in FIG. 4H. In some embodiments, the conductive trace 108 is disposed by electroplating or sputtering. In some embodiments, the conductive trace 108 is disposed so that the conductive trace 108 travels along a recess 103a of the passivation 103, the recess 105a of the dielectric 105, the recess 107a of the dielectric 107, and a top surface 107b of the dielectric 107. In some embodiments, the dielectric 107 includes a polymeric material such as epoxy, polyimide, polybenzoxazole (PBO), solder resist (SR), ABF film, and the like.

Figure 4I:
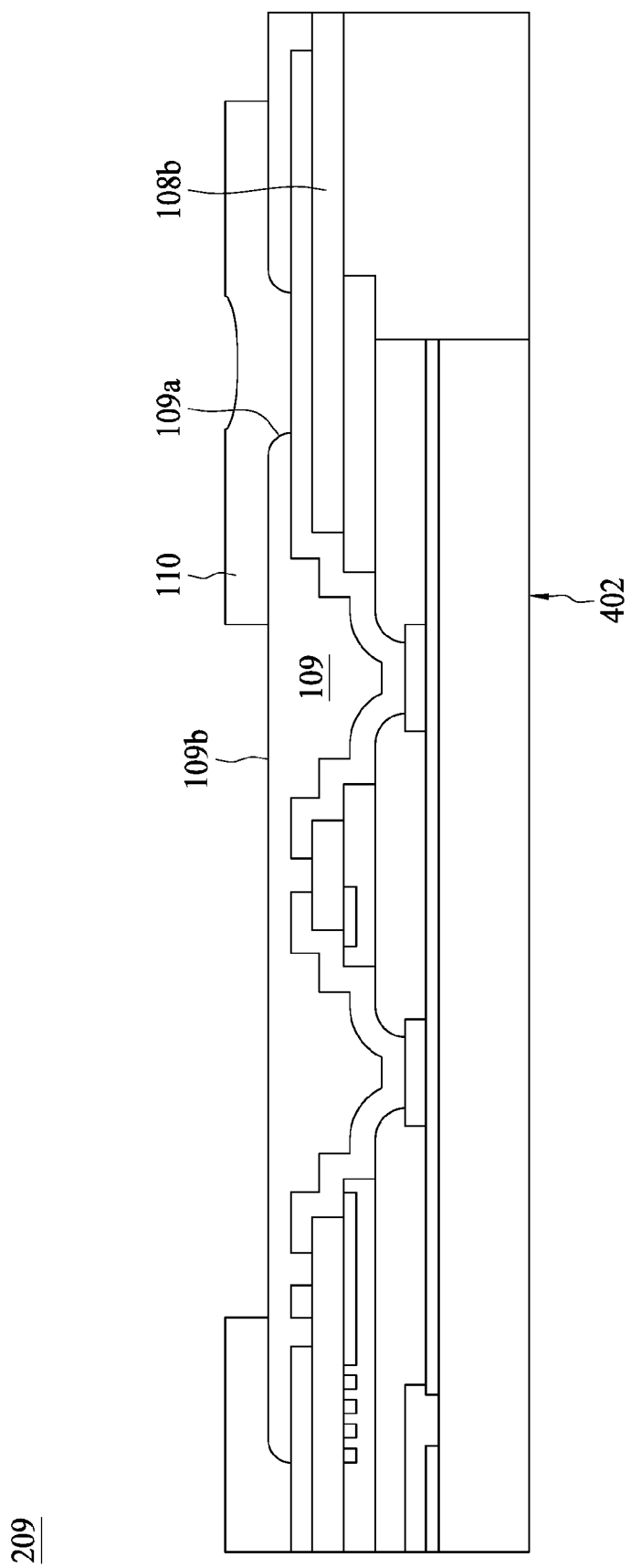

In operation 209, a dielectric 109 is disposed over the conductive trace 108, a recess 109a is formed to expose a portion 108b of the conductive trace 108, and a bond pad 110 is disposed as in FIG. 4I. In some embodiments, the dielectric 109 includes a polymeric material such as epoxy, polyimide, polybenzoxazole (PBO), solder resist (SR), ABF film, and the like. In some embodiments, the bond pad 110 is formed above a portion 108b of the conductive trace 108 and the dielectric 109. In some embodiments, the bond pad 110 fills the recess 109a and extends from a top surface 109b of the dielectric 109 to the portion 108b of the conductive trace 108, so that the bond pad 110 is electrically connected with the conductive trace 108. In some embodiments, the bond pad 110 is an under bump metallurgy (UBM) pad which is a solderable surface for receiving a bump and electrically connecting the bond pad 110 with the circuitry external to the semiconductor die 402.

Figure 4J:
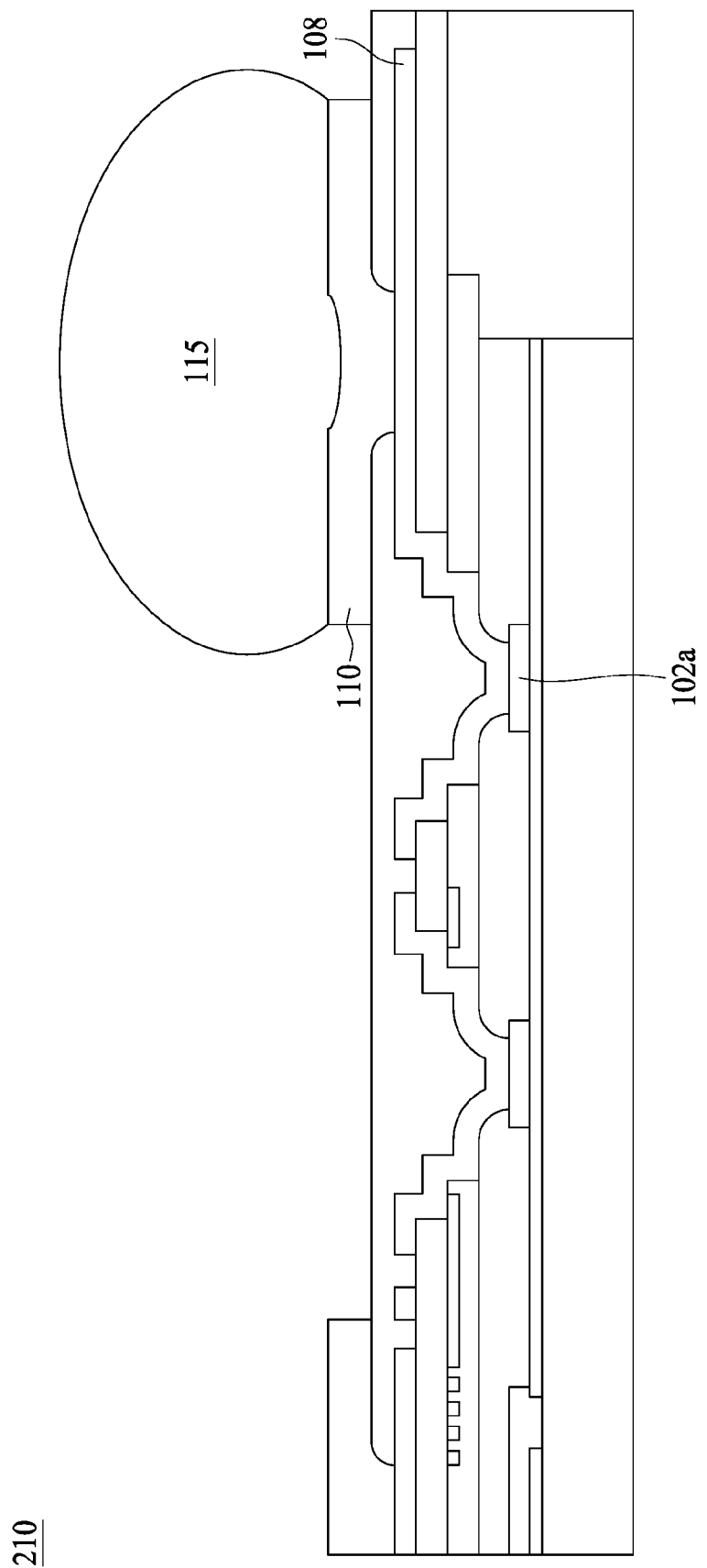

In operation 210, a bump 115 is disposed on the bond pad 110 as in FIG. 4J. In some embodiments, the bump 115 is a solder bump, solder ball, solder paste or etc. In some embodiments, the bump 115 is configured for attaching with a pad on another die, another substrate or another semiconductor package. In some embodiments, the bump 115 is a conductive bump or a conductive joint. In some embodiments, the conductive pad 102a is electrically connected with the bump 115 through the conductive trace 108 and the bond pad 110.

Figure 4K:
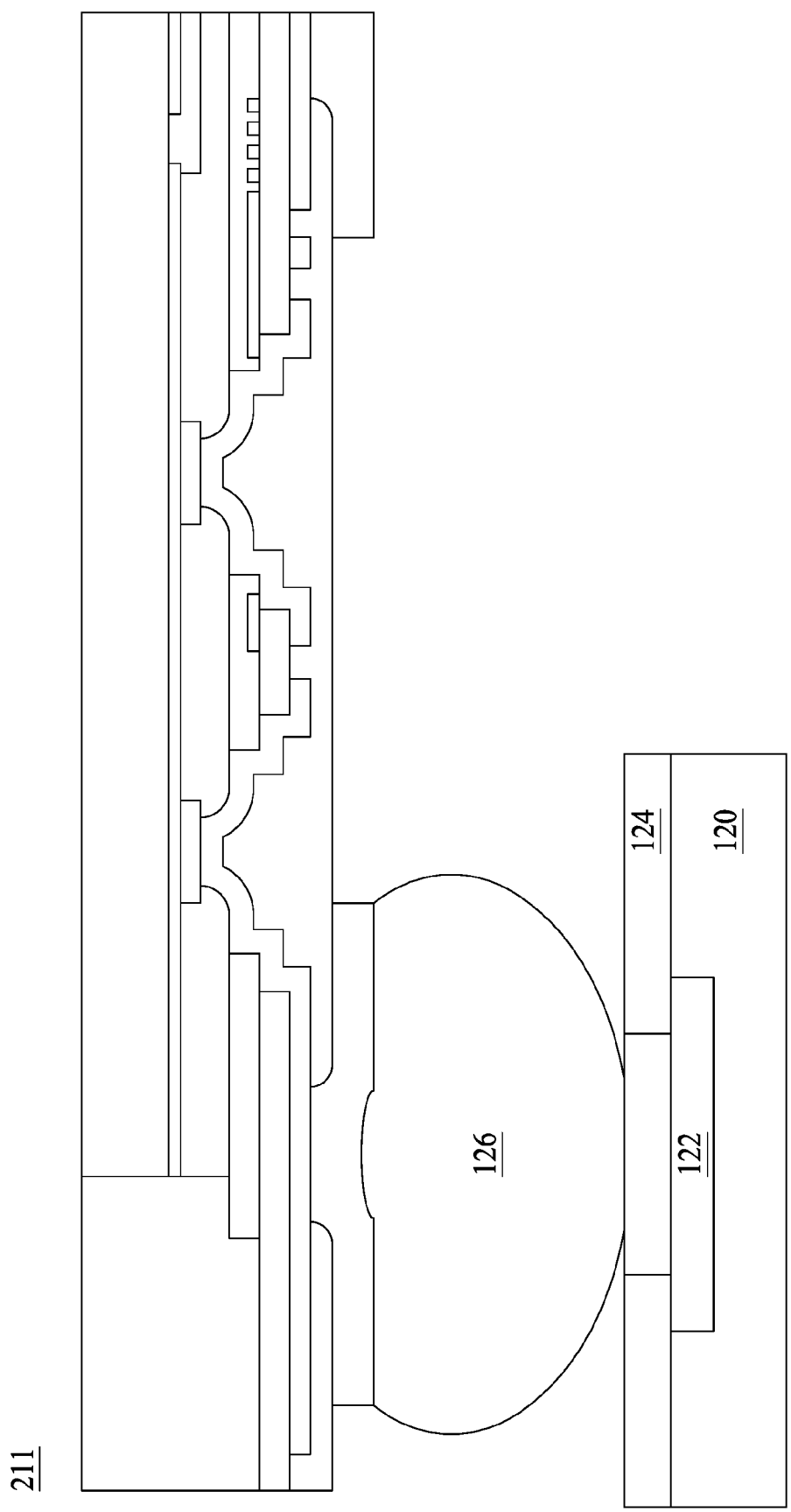

In operation 211, the structure shown in FIG. 4J is flipped upside down and attached to another substrate 120 at the bottom of FIG. 4K. The substrate 120 may be a package substrate, board (e.g., a printed circuit board (PCB)), a wafer, a die, an interposer substrate, or other suitable substrate. The bump structure is coupled to the substrate 120 through various conductive attachment points. For example, a conductive region 122 is formed and patterned on the substrate 120. The conductive region 122 is a contact pad or a portion of a conductive trace, which is presented by a mask layer 124. In one embodiment, the mask layer 124 is a solder resist layer formed and patterned on the substrate 120 to expose the conductive region 122. The mask layer 124 has a mask opening, which provides a window for solder joint formation. For example, a solder layer including alloys of tin, lead, silver, copper, nickel, bismuth, or combinations thereof may be provided on the conductive region 122. The semiconductor device 100 can be coupled to the substrate 120 through a joint solder structure 126 between the bond pad 114 and the conductive region 122. An exemplary coupling process includes a flux application, chip placement, reflowing of melting solder joints, and/or cleaning of flux residue. The semiconductor substrate 102, the joint solder structure 126, and the other substrate 120 may be referred to as a packaging assembly, or in the present embodiment, a flip-chip packaging assembly.

In some embodiments, the semiconductor device 100 is bonded with another package by a package bump to become a package on package (PoP). In some embodiments, the semiconductor device 100 is electrically connected with another package through the package bump. In some embodiments, several conductive members of the semiconductor device 100 are correspondingly bonded with several package pads of another package through several package bumps to become PoP.

In some embodiments, a semiconductor device includes a semiconductor substrate, a conductive pad on the semiconductor substrate, and a first dielectric over the semiconductor substrate. The semiconductor device also includes a conductive layer disposed in the first dielectric and a second dielectric disposed on the conductive layer. In the semiconductor device, at least a portion of the conductive layer is exposed from the first dielectric and second dielectric. The semiconductor device further includes a conductive trace partially over the second dielectric and in contact with the exposed portion of the conductive layer. In the semiconductor device, the conductive trace is connected to the conductive pad at one end.

In some embodiments, a semiconductor device includes a semiconductor substrate, a conductive pad on the semiconductor substrate, and a dielectric over the semiconductor substrate. The semiconductor device also includes a molding compound surrounding the semiconductor substrate, the conductive pad and the dielectric. In the semiconductor device, the molding compound comprises a corner recessed from an interface between the molding compound and the semiconductor substrate.

In some embodiments, a method of manufacturing a semiconductor device includes providing a substrate, disposing a conductive trace over substrate, and disposing a dielectric on the conductive trace. The method further includes providing a semiconductor die and flipping the semiconductor die upside down to attach the semiconductor die to the substrate; and removing the semiconductor substrate to expose the conductive trace.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate;
a conductive pad on the semiconductor substrate;
a first dielectric over the semiconductor substrate;
a conductive layer disposed in the first dielectric;
a second dielectric disposed on the conductive layer, wherein at least a portion of the conductive layer is exposed from the first dielectric and second dielectric; and,
a conductive trace partially over the second dielectric and in contact with the exposed portion of the conductive layer, wherein the conductive trace is connected to and in direct contact with the conductive pad at one end.

2. The semiconductor device in claim 1, further comprising a molding surrounding the semiconductor substrate.

3. The semiconductor device in claim 1, wherein the conductive layer is a post passivation interconnection (PPI).

4. The semiconductor device in claim 1, further comprising a passivation partially covering the conductive pad.

5. The semiconductor device in claim 1, wherein the conductive layer is proximal to the second dielectric.

6. The semiconductor device in claim 1, wherein the conductive trace comprises two sides parallel to the conductive pad.

7. The semiconductor device in claim 6, wherein one of the two sides is in contact with the second dielectric.

8. The semiconductor device in claim 1, wherein the exposed portion is proximal to a corner of the first dielectric.

9. The semiconductor device in claim 1, wherein the conductive trace is conformally lining along a recess in the first dielectric.

10. The semiconductor device in claim 1, wherein the conductive trace is conformally lining along a recess in the second dielectric.

11. A semiconductor device, comprising:
a semiconductor substrate;
a conductive pad on the semiconductor substrate;
a dielectric over the semiconductor substrate;
a molding compound surrounding the semiconductor substrate, the conductive pad and the dielectric; wherein the molding compound comprises a corner recessed from an interface between the molding compound and the semiconductor substrate, and the dielectric is extended into the corner recessed from the interface of the molding compound.

12. The semiconductor device in claim 11, wherein a top surface of the molding is coplanar with a top surface of the dielectric.

13. The semiconductor device in claim 11, wherein a portion of the dielectric is over the molding compound.

14. The semiconductor device in claim 11, further comprising a conductive trace lining along a recess in the dielectric.

15. The semiconductor device in claim 11, further comprising a conductive layer in the dielectric.

16. The semiconductor device in claim 15, wherein a portion of the conductive layer is exposed from the dielectric and in contact with a conductive trace.

17. The semiconductor device in claim 16, wherein at least portion of the conductive trace is over the conductive layer, and at least a portion of the conductive trace is connected to a conductive pad, wherein the conductive pad is under the conductive layer.

18. The semiconductor device in claim 1, wherein from a top view, the conductive layer is configured as a loop and the conductive pad is inside the loop.

19. The semiconductor device in claim 1, wherein from a top view, the conductive layer is in a C-shape with one open end.

20. The semiconductor device in claim 1, the conductive layer comprising a C-shaped ring connected to an extension portion, wherein the extension portion is a running RDL.

* * * * *